United States Patent [19]

Nakamura et al.

[11] Patent Number: 5,652,045
[45] Date of Patent: Jul. 29, 1997

[54] COATED TUNGSTEN CARBIDE-BASED CEMENTED CARBIDE BLADE MEMBER

[75] Inventors: Eiji Nakamura; Kazuhiro Akiyama; Ikuro Suzuki, all of Omiya, Japan

[73] Assignee: Mitsubishi Materials Corporation, Tokyo, Japan

[21] Appl. No.: 541,088

[22] Filed: Oct. 11, 1995

[30] Foreign Application Priority Data

Oct. 20, 1994 [JP] Japan ................... 6-281459
Oct. 25, 1994 [JP] Japan ................... 6-284264
Dec. 28, 1994 [JP] Japan ................... 6-340058
Dec. 28, 1994 [JP] Japan ................... 6-340059

[51] Int. Cl.$^6$ ............................................ B23B 27/14
[52] U.S. Cl. .................... 428/216; 51/307; 51/309; 428/212; 428/336; 428/467; 428/698
[58] Field of Search ........................... 428/698, 469, 428/336, 212, 216; 57/307, 309

[56] References Cited

U.S. PATENT DOCUMENTS 4,018,631  4/1977  Hale ........................ 148/31.5
5,487,625  1/1996  Ljungberg et al. ........... 407/119

*Primary Examiner*—Archene Turner
*Attorney, Agent, or Firm*—Oblon, Spivak, McClelland, Maier & Neustadt, P.C.

[57] ABSTRACT

A surface-coated tungsten carbide-based cemented carbide blade member including a tungsten carbide-based cemented carbide substrate, and a hard coating of an average layer thickness of 3 to 30 μm formed thereon is disclosed. The hard coating includes a first layer deposited on the substrate, a second layer deposited on the first layer, and a third layer deposited on the second layer. The first layer has a granular crystal structure, while the second layer has an elongated crystal structure. Among the constituents forming the substrate, at least tungsten and cobalt are diffused into the grain boundaries of the first and second layers.

9 Claims, No Drawings

COATED TUNGSTEN CARBIDE-BASED CEMENTED CARBIDE BLADE MEMBER

BACKGROUND OF THE INVENTION

1. Field of the Invention

The present invention relates to a surface-coated tungsten carbide-based cemented carbide blade member which has hard coating layers possessing an excellent bonding strength, so that even when used for cutting with a large cutting resistance, e.g., cutting of mild steels, it exhibits an exceptional cutting performance for a prolonged period of time.

2. Conventional Art

Conventionally, as described in Japanese Patent Applications, B-Publication Nos. 57-1585 and 59-52703, surface-coated cemented carbide blade members principally for use in turning and milling of alloy steels and cast iron are well known in the art. Such a blade member comprises: a substrate of a tungsten carbide-based cemented carbide which may be entirely homogeneous in structure, or which may have a surface zone rich in binder constituents such as cobalt as opposed to an interior portion; and a hard coating of an average layer thickness of 3 to 30 μm formed on the substrate by means of chemical vapor deposition or physical vapor deposition and including a first layer of titanium nitride (hereinafter referred to as TiN), a second layer of titanium carbonitride (hereinafter referred to as TiCN), and a third layer of aluminum oxide (hereinafter referred to as $Al_2O_3$). The hard coating may optionally include a fourth layer of TiN, and an intermediate layer of titanium carbide (hereinafter referred to as TiC) between the second and third layers.

Furthermore, in recent years, in addition to the progressing need for unmanned operation of the cutting processes, factory automatization of the cutting machines is remarkable, and universality tends to be required for cutting tools in general. In the case of the conventional coated blade members of the aforesaid type, they can be used without any problems for cutting alloy steels or cast iron. However, inasmuch as bonding strength of the hard coating is not adequate, the hard coating is susceptible to layer separation or chipping when the blade member is used for the cutting operation of mild steels involving high cutting resistance. For this reason, the tool life of the blade member is relatively short.

SUMMARY OF THE INVENTION

Observing the above-identified problems associated with the conventional blade members, the inventors have made an extensive study to enhance the bonding strength of the hard coating. As a result, it was discovered that:

(a) in the hard coating of the conventional coated cemented carbide blade members, although the first layer of TiN has a relatively strong bonding strength with respect to the cemented carbide substrate, the bonding strengths between the respective layers, i.e., layer-to-layer bonding strengths, are insufficient, resulting in layer separations or chipping;

(b) whereas, in the hard coating of the conventional coated cemented carbide blade members, the first layer of TiN, the second layer of TiCN, all of the optional fourth layer of TiN, and the optional intermediate layer of TiC have granular crystal structures, and the third layer of $Al_2O_3$ has an α-type crystal structure, the bonding strengths of the second layer of TiCN with respect to the first layer of TiN and the third layer of $Al_2O_3$, and the bonding strength of the third layer of $Al_2O_3$ with respect to the optional fourth layer of TiN, as well as the bonding strength of the optional intermediate layer of TiC with respect to the associated adjacent layers, are remarkably enhanced by modifying the crystal structures of the layers such that the second layer of TiCN has a crystal structure of unilaterally grown elongated crystals whereas the third layer of $Al_2O_3$ has a crystal structure including κ-type and/or α-type crystals: and (c) by heat-treating the substrate coated with the second layer of TiCN or the optional intermediate layer of TiC to 850° to 1100° C. in a hydrogen atmosphere of 10 to 100 torr for 1 to 5 hours, the constituents of the cemented carbide substrate, at least tungsten and cobalt, are adequately diffused at a prescribed W/Co atomic ratio into the grain boundaries of the first and second layers and the optional intermediate layer due to capillary action, and the resulting first and second layers, as well as the optional intermediate layer, come to contain at least tungsten and cobalt therein, so that, in addition to the increase of bonding strength between crystal grains, the layer-to-layer bonding strength as well as the bonding strength between the hard coating and the substrate are substantially enhanced.

Thus, according to the present invention, there is provided a surface-coated tungsten carbide-based cemented carbide blade member comprising: a tungsten carbide-based cemented carbide substrate; and a hard coating of an average layer thickness of 3 to 30 μm formed thereon and including a first layer deposited on the substrate, a second layer deposited on the first layer and a third layer deposited on the second layer, characterized in that (a) the first layer has a granular crystal structure while the second layer has a crystal structure of unilaterally grown elongated crystals; and that (b) among the constituents forming the cemented carbide substrate, at least tungsten (W) and cobalt (Co) (inclusive of carbon (C)) are diffused into the grain boundaries of the first and second layers.

With this construction, the blade member of the invention comes to have a hard coating possessing exceptional layer-to-layer bonding strengths and bonding strengths between the hard coating and the substrate. Accordingly, in addition to the cutting operations for alloy steels and cast iron, the blade members can be used for cutting operations undergoing a large cutting resistance, e.g., cutting of mild steels, and exhibit an exceptional cutting performance for a prolonged period of time.

DETAILED DESCRIPTION OF THE INVENTION

Thus, the surface-coated tungsten carbide-based cemented carbide blade member in accordance with the present invention comprises: a tungsten carbide-based cemented carbide substrate; and a hard coating of an average layer thickness of 3 to 30 μm formed thereon and including a first layer deposited on the substrate, a second layer deposited on the first layer and a third layer deposited on the second layer, and is characterized in that (a) the first layer has a granular crystal structure while the second layer has a crystal structure of unilaterally grown elongated crystals; and that (b) among the constituents forming the cemented carbide substrate, at least tungsten and cobalt (inclusive of carbon) are diffused into the grain boundaries of the first and second layers.

In the foregoing, the tungsten carbide-based cemented carbide substrate may be entirely homogeneous in structure, or may have a surface zone rich in binder constituents. Typically, the tungsten carbide-based cemented carbide which may be used in the context of the present invention may comprise cobalt as a binder phase forming component and balance tungsten carbide as a hard dispersed phase forming component. It may further contain, as a dispersed phase component, carbides, nitrides and/or carbonitrides of metals selected from Group $IV_A$, $V_A$, $VI_A$ of the Periodic Table.

With respect to the hard coating, if the average thickness of the hard coating is less than 3 μm, a desired wear resistance cannot be ensured. On the other hand, at over 30 μm, the fracturing resistance suddenly deteriorates. Therefore, the average thickness of the hard coating has been determined so as to range from 3 to 30 μm.

In the hard coating, it is preferable that the first layer be formed of one of TiN, TiC, and TiCN, the second layer be formed of TiCN, and the third layer be formed of $Al_2O_3$ based on κ-type and/or α-type crystals. The average thicknesses of the first layer of TiN or the like, the second layer of TiCN, and the third layer of $Al_2O_3$ are preferably from 0.1 to 5 μm, from 1 to 20 μm, and from 0.1 to 15 μm, respectively, and more preferably from 0.1 to 2 μm, from 3 to 15 μm, and from 1 to 10 μm, respectively.

In addition, the hard coating may have one or more optional coating layers as long as the total coating thickness does not exceed 30 μm. More specifically, an intermediate layer of TiC may be preferably deposited between the second layer and the third layer so as to have a granular crystal structure and a layer thickness of 0.1 to 5 μm. The hard coating may still have an intervening layer of TiCO (titanium oxycarbide) or TiCNO (titanium oxycarbonitride) deposited between the second layer and the third layer so as to have a granular crystal structure and a layer thickness of 0.1 to 5 μm. When the aforesaid intermediate layer is formed, this intervening layer of granular TiCO or TiCNO crystal structure may be formed between the intermediate layer and the third layer, but its average thickness is determined such that the total thickness of the intervening layer and the intermediate layer ranges from 0.1 to 5 μm.

The hard coating may further comprise an optional fourth layer of granular TiN or TiCN formed on the third layer and having an average layer thickness of 0.1 to 5 μm. Furthermore, the third layer may have a composite layer structure including at least one dividing layer to define at least three sublayers therein, the dividing layer being formed of at least one of TiC, TiN, TiCN, TiCO and TiCNO. The thickness of such dividing layer may be preferably from 0.01 to 1 μm, and the total thickness of the composite layer structure may be preferably from 1 to 10 μm.

Moreover, among the constituents forming the cemented carbide substrate, at least the tungsten (W) and the cobalt (Co) (inclusive of carbon) are diffused into the grain boundaries of the first and second layers to form with titanium compounds grain boundary phases. In this regard, it is preferable that the amounts (atomic %) of the tungsten and cobalt (inclusive of carbon) diffused into the grain boundaries of the first and second layers be greater at a zone adjacent to the substrate and decrease towards the top surface of the hard coating. Furthermore, with respect to each of tungsten and cobalt, it is preferable that such diffused amount in the first layer be no less than 5 atomic %. Moreover, it is preferable that the atomic ratio of such diffused tungsten to cobalt at a zone 0.1 to 0.3 μm apart from the substrate surface satisfy the following relationship:

3/5<W/Co

This is because at less than 3/5, a sufficient amount of diffused tungsten is not obtained, and the bonding strength with respect to the substrate is inadequate to avoid separation of the overall hard coating during the cutting operation. The upper limit for this ratio may preferably be around 1. The above value 3/5 is a value obtained by analyzing the portion adjacent to the substrate, typically by transmission electron microscopic measurement of the portion at a distance of 0.1 to 0.2 μm from the substrate surface.

When analyzing the amount of tungsten in comparison with that of cobalt, the tungsten amount is rich in a position adjacent to the substrate, and decreases in a direction away from the substrate. The decreasing tendency of the tungsten amount is greater than that of the cobalt amount, and the grain boundaries, which contain little tungsten and are rich in cobalt, are seen at the portions spaced apart from the substrate. At the portions further remote from the substrate, the diffused layers almost tend to disappear.

As described in Japanese Patent Application, A-Publication No. 6-8010, among the respective layers of the hard coating, the second layer of elongated crystal TiCN may be preferably formed under the following conditions:

(a) Reaction gas composition: 1 to 4% by volume of $TiCl_4$, 1 to 5% by volume of $CH_3CN$, 0 to 35 % by volume of $N_2$ and balance $H_2$ (b) Reaction temperature: 850° to 950° C.

(c) Ambient pressure: 30 to 200 torr.

Furthermore, the layer of granular TiCN crystals may be ordinarily formed under the following conditions:

(a) Reaction gas composition: 1 to 5% by volume of $TiCl_4$, 2 to 7% by volume of $CH_4$, 15 to 30% by volume of $N_2$ and balance $H_2$ (b) Reaction temperature: 950° to 1050° C.

(c) Ambient pressure: 30 to 200 torr.

Moreover, the $Al_2O_3$ layer consisting essentially of κ-type crystals may be formed under the following conditions:

(a) Reaction gas composition: 1 to 20% by volume of $AlCl_3$ and balance $H_2$, or 1 to 20% by volume of $AlCl_3$, 1 to 20% by volume of HCl and/or 0.05 to 5% by volume of $H_2S$, and balance $H_2$ for an initial stage of 1 to 120 minutes; and 1 to 20% by volume of $AlCl_3$, 0.5 to 30% by volume of $CO_2$, and balance $H_2$, or 1 to 20% by volume of $AlCl_3$, 0.5 to 30% by volume of $CO_2$, 1 to 20% by volume of HCl and/or 0.05 to 5% by volume of $H_2S$, and balance $H_2$ for the later stage;

(b) Reaction temperature: 850° to 1000° C.

(c) Ambient pressure: 30 to 200 torr.

Thus, the hard coating of the blade member of the invention may be formed by means of chemical vapor deposition method or physical vapor deposition method under the aforesaid and conventional conditions, by depositing initially a first layer of TiN or the like on the surface of the cemented carbide substrate, subsequently depositing the second layer of TiCN and the third layer of $Al_2O_3$, and optionally the fourth layer of TiN or the like. In this process, during the formation of the second layer and the subsequent outer layers, the carbon component in the cemented carbide substrate may be occasionally diffused into the first layer of TiN or the like to form a solid solution therewith. In this case, when the first layer is of TiN, it may partially or totally turn into TiCN.

The present invention will now be explained in more detail by way of the following example.

EXAMPLE

As the raw materials, 3 μm medium grain WC powder, 5 μm coarse grain WC powder, 1.5 μm (Ti,W)C (by weight ratio, TiC/WC=30/70) powder, 1.2 μm (Ti,W)(C,N) (TiC/ TiN/WC=24/20/56) powder, and 1.2 μm Co powder were prepared, then these raw material powders were blended in the compositions shown in Table 2 and wet-mixed in a ball mill for 72 hours. After drying, they were press-shaped into green compacts of the form of ISO CNMG 120408 (cemented carbide substrates A-C) and SEEN 42 AFTN1 (cemented carbide substrate D), then these green compacts were sintered in vacuum under the conditions described in Table 2, thus resulting in the production of cemented carbide substrates A to D.

Furthermore, in the case of the above cemented carbide substrate A, after maintenance in an atmosphere of $CH_4$ gas at 100 torr and a temperature of 1400° C. for 1 hour, a gradually cooling carburizing procedure was run, then, by removing the carbon and Co attached to the substrate surface using acid and barrel polishing, a Co-rich region 40 μm deep was formed in the substrate surface layer wherein, at a position 10 μm from the surface, the maximum Co content was 15% by weight.

Moreover, in the case of cemented carbide substrate C above, while sintered, a Co-rich region 20 μm deep was formed wherein, at a position 15 μm from the surface, the maximum Co content was 9% by weight, and in the remaining cemented carbide substrates B and D, no Co-rich region was formed, and they had homogeneous structures over their entirety. The hardnesses of the interior portions of the above cemented carbide substrates in Rockwell A-Scale were also measured, and the results are also set forth in Table 2.

Subsequently, after honing the surfaces of the cemented carbide substrates A to D, hard coatings having compositions, crystal structures and average layer thicknesses shown in Tables 4 to 9 were formed on the substrates under the conditions shown in Table 3 by using a usual chemical vapor deposition apparatus, and by maintaining the resulting coated substrates, after the formation of the second layer, in a hydrogen atmosphere of 5 torr at a temperature of 1050° C. for a prescribed period from 1 to 5 hours to heattreat the same, the coated cemented carbide blade members of the present invention 1 to 33 were produced, whereas, without heat treatment above, the comparative coated cemented carbide blade members 1 to 11 were produced.

With respect to the coated cemented carbide blade member 6 of the invention, the W and Co distributions in the grain boundaries of the hard coating were investigated by specifying the grain boundary using a transmission electron microscope and analyzing the same quantitatively using an energy dispersive X-ray spectroscopy. The results are set forth in Table 1, from which it is seen that the W amount decreased abruptly from a position of around 1 μm from the substrate surface, whereas the Co amount suddenly decreased from the position of around 3 μm from the surface.

Similarly, the W and Co distributions for the remaining coated cemented carbide blade members 1–7 and 9–33 of the invention were investigated, and the same distribution was confirmed.

Furthermore, with respect to the first, second and optional intermediate layers of the coated cemented carbide blade members thus obtained, the average W and Co contents in a respective layer were obtained by taking the average over five points in each layer. The results are also shown in Tables 4 to 9.

Then, for the coated cemented carbide blade members of the invention 1–5, 8–12, 15–19, 22–26, and 29–32, and the comparative coated cemented carbide blade members 1–4, 6–7, and 9–10, a mild steel continuous cutting test was performed under the following conditions:

Workpiece: mild steel round bar
Cutting Speed: 335 m/min
Feed: 0.25 mm/rev
Depth of Cut: 2 mm
Cutting Time: 20 min Furthermore, an interrupted cutting test was performed under the following conditions:

Workpiece: mild steel square block
Cutting Speed: 305 m/min
Feed: 0.26 mm/rev
Depth of Cut: 1.5 mm
Cutting Time: 25 min In either of the tests, the widths of flank wear of the cutting edges were measured. The results are set forth in Tables 4 to 9.

Furthermore, for the coated cemented carbide blade members of the invention 6, 7, 13, 14, 20, 21, 27, 28 and 33, and the comparative coated cemented carbide blade members 5, 8 and 11, a mild steel milling test was performed under the following conditions:

Workpiece: mild steel square block
Cutting Speed: 305 m/min
Feed: 0.36 mm/tooth
Depth of Cut: 2.5 mm
Cutting Time: 30 min in which flank wear widths of the cutting edges were measured. The results are also set forth in Tables 4 to 9.

As can be seen from Tables 4 to 9, all of the coated cemented carbide blade members of the invention 1 to 33 demonstrate the properties that even though the cutting operations of mild steels involve a large cutting resistance, there occurs neither layer separation nor chipping in the hard coating, and an exceptional bonding strength between layers can be obtained. In contrast, due to insufficient bonding strength between layers in the hard coating, the comparative coated cemented carbide blade members 1 to 11 were subjected to the layer separations or chipping during the mild steel cutting operations, and their tool lives ended in a relatively short time.

TABLE 1

| Distance from Substrate Surface | 0.1 μm | 0.3 μm | 1.0 μm | 3.0 μm | 6.0 μm |
| --- | --- | --- | --- | --- | --- |
| W Amount | 6.8 at % | 7.6 at % | 4.1 at % | 0.3 at % | 0.3 at % |
| Co Amount | 5.2 at % | 7.7 at % | 6.3 at % | 4.4 at % | 2.4 at % |

TABLE 2

| Type | | Co | Blend Composition (% by weight) (Ti, W)C | (Ti, W)CN | (Ta, Nb)C | WC | Sintering Conditions Pressure (torr) | Temperature (°C.) | Holding Time (hours) | Interior Hardness ($H_RA$) |
|---|---|---|---|---|---|---|---|---|---|---|
| Cemented Carbide Substrate | A | 5 | 5 | — | 5 | Balance (medium grain) | 0.05 | 1450 | 1 | 91.0 |
| | B | 9 | 8 | — | 5 | Balance (medium grain) | 0.05 | 1380 | 1.5 | 90.3 |
| | C | 5 | — | 5 | 3 | Balance (medium grain) | 0.10 | 1410 | 1 | 91.1 |
| | D | 10 | — | — | 2 | Balance (coarse grain) | 0.05 | 1380 | 1 | 89.7 |

TABLE 3

| Hard Coating Composition | Crystal Structure (Vol:%) | Conditions for forming Hard Coating Compositions of Reaction Gases (Vol %) | Reaction Atmosphere Pressure (torr) | Temperature (°C.) |
|---|---|---|---|---|
| TiN (1st layer) | granular | $TiCl_4$:2%,$N_2$:25%,$H_2$:Remainder | 50 | 920 |
| TiN (4th layer) | granular | $TiCl_4$:2%,$N_2$:30%,$H_2$:Remainder | 200 | 1020 |
| TiCN | Elongated Growth | $TiCl_4$:2%,$CH_3CN$:0.6%,$N_2$:20%,$H_2$:Remainder | 50 | 910 |
| TiCN | granular | $TiCl_4$:2%,$CH_4$:4%,$N_2$:20%,$H_2$:Remainder | 50 | 1020 |
| TiC | granular | $TiCl_4$:2%,$CH_4$:5%,$H_2$:Remainder | 50 | 1020 |
| TiCO | granular | $TiCl_4$:2%,CO:6%,$H_2$:Remainder | 50 | 980 |
| TiCNO | granular | $TiCl_4$:2%,CO:3%,$N_2$:5%,$H_2$:Remainder | 50 | 980 |
| $Al_2O_3$ | κ type:100% | Initial Stage; 30 min;$AlCl_3$:3%,$H_2$:Remainder, Subsequent Stage;$AlCl_3$:3%,$H_2S$:0.3%,$CO_2$:5%,$H_2$:Remainder | 50 | 970 |
| $Al_2O_3$ | κ type:85% | Initial Stage; 30 min;$AlCl_3$:3%,$H_2$:Remainder, Subsequent Stage;$AlCl_3$:3%,$H_2S$:0.2%,$CO_2$:6%,$H_2$:Remainder | 50 | 980 |
| $Al_2O_3$ | κ type:55% | Initial Stage; 30 min;$AlCl_3$:3%,$H_2S$:0.05%,$H_2$:Remainder, Subsequent Stage;$AlCl_3$:3%,$H_2S$:0.1%,$CO_2$:8%,$H_2$:Remainder | 50 | 1000 |
| $Al_2O_3$ | α type:100% | $AlCl_3$:3%,$CO_2$:10%,$H_2$:Remainder | 100 | 1020 |

TABLE 4-1

| | | | Hard Coating | | | | | | |
|---|---|---|---|---|---|---|---|---|---|
| | | | 1st Layer | | | | 2nd Layer | | |
| Type | Substrate Symbol | Composition (ALT) | Crystal Structure | W (atomic %) | Co (atomic %) | Composition (ALT) | Crystal Structure | W (atomic %) | Co (atomic %) |
| Coated Cemented Carbide Blade Members of the Invention | 1 | C | TiN(0.9) | Granular | 18.7 | 17.2 | TiCN(6.3) | Elongated Growth | 5.43 | 9.76 |
| | 2 | C | TiN(1.6) | Granular | 5.2 | 5.3 | TiCN(6.5) | Elongated Growth | 1.48 | 2.50 |
| | 3 | C | TiN(3.0) | Granular | 4.3 | 3.4 | TiCN(15.8) | Elongated Growth | 0.8 | 0.9 |
| | 4 | A | TiC(0.3) | Granular | 13.4 | 15.3 | TiCN(3.2) | Elongated Growth | 5.7 | 8.2 |
| | 5 | B | TiCN(0.3) | Granular | 15.1 | 12.5 | TiCN(3.4) | Elongated Growth | 6.1 | 6.0 |
| | 6 | D | TiC(0.2) | Granular | 7.2 | 6.4 | TiCN(4.1) | Elongated Growth | 2.1 | 4.2 |
| | 7 | D | TiC(0.1) | Granular | 20.2 | 17.8 | TiCN(4.2) | Elongated Growth | 6.3 | 14.9 |

Note: ALT denotes an average layer thickness in μm.
W and Co denote the contents at the grain boundaries.

TABLE 4-2

| Type | | 3rd Layer Composition (ALT) | 3rd Layer Crystal Structure | 4th Layer Composition (ALT) | 4th Layer Crystal Structure | Flank Wear Width (mm) Continuous Cutting | Flank Wear Width (mm) Interrupted Cutting |
|---|---|---|---|---|---|---|---|
| Coated | 1 | Al₂O₃(5.8) | κ:100% | — | — | 0.16 | 0.21 |
| Cemented | 2 | Al₂O₃(5.9) | α:100% | TiN(0.5) | Granular | 0.14 | 0.20 |
| Carbide | 3 | Al₂O₃(1.0) | α:100% | TiCN(0.4) | Granular | 0.26 | 0.32 |
| Blade | 4 | Al₂O₃(10.4) | κ:85% | — | — | 0.18 | 0.22 |
| Members | 5 | Al₂O₃(11.5) | κ:55% | — | — | 0.19 | 0.23 |
| of the | 6 | Al₂O₃(0.8) | κ:100% | TiN(0.2) | Granular | 0.20 | (Milling) |
| Invention | 7 | Al₂O₃(0.9) | α:100% | TiCN(0.3) | Granular | 0.20 | (Milling) |

Note: ALT denotes an average layer thickness in μm.
κ denotes a κ-type.
α denotes an α-type.

TABLE 5-1

| Type | | Substrate Symbol | Hard Coating 1st Layer Composition (ALT) | 1st Layer Crystal Structure | 1st Layer W (atomic %) | 1st Layer Co (atomic %) | 2nd Layer Composition (ALT) | 2nd Layer Crystal Structure | 2nd Layer W (atomic %) | 2nd Layer Co (atomic %) |
|---|---|---|---|---|---|---|---|---|---|---|
| Coated | 8 | C | TiN(0.7) | Granular | 19.3 | 18.0 | TiCN(6.5) | Elongated Growth | 6.7 | 10.4 |
| Cemented Carbide | 9 | C | TiN(1.6) | Granular | 5.4 | 5.2 | TiCN(6.4) | Elongated Growth | 1.5 | 2.3 |
| Blade Members | 10 | C | TiN(2.9) | Granular | 4.6 | 3.3 | TiCN(15.9) | Elongated Growth | 0.8 | 0.9 |
| of the Invention | 11 | A | TiC(0.2) | Granular | 21.4 | 19.2 | TiCN(3.3) | Elongated Growth | 6.9 | 15.1 |
| | 12 | B | TiCN(0.3) | Granular | 15.7 | 12.7 | TiCN(3.2) | Elongated Growth | 6.1 | 10.1 |
| | 13 | D | TiC(0.1) | Granular | 20.5 | 17.9 | TiCN(4.2) | Elongated Growth | 6.2 | 14.8 |
| | 14 | D | TiC(0.2) | Granular | 20.0 | 17.1 | TiCN(4.0) | Elongated Growth | 6.1 | 14.4 |

Note: ALT denotes an average layer thickness in μm.
W and Co denote the contents at the grain boundaries.

TABLE 5-2

| Type | | Intervening Layer Composition (ALT) | Intervening Layer Crystal Structure | 3rd Layer Composition (ALT) | 3rd Layer Crystal Structure | 4th Layer Composition (ALT) | 4th Layer Crystal Structure | Flank Wear Width (mm) Continuous Cutting | Flank Wear Width (mm) Interrupted Cutting |
|---|---|---|---|---|---|---|---|---|---|
| Coated | 8 | TiCNO(0.1) | Granular | Al₂O₃ (6.0) | κ:100% | — | — | 0.14 | 0.20 |
| Cemented | 9 | TiCNO(0.2) | Granular | Al₂O₃ (5.9) | α:100% | TiN(0.4) | Granular | 0.19 | 0.21 |
| Carbide | 10 | TiCNO(0.2) | Granular | Al₂O₃ (1.0) | α:100% | TiCN(0.5) | Granular | 0.28 | 0.30 |
| Blade | 11 | TiCO(0.2) | Granular | Al₂O₃ (10.5) | κ:85% | — | — | 0.18 | 0.20 |
| Members | 12 | TiCO(0.2) | Granular | Al₂O₃ (11.6) | κ:55% | — | — | 0.18 | 0.19 |
| of the | 13 | TiCNO(0.3) | Granular | Al₂O₃ (0.8) | κ:100% | TiN(0.3) | Granular | 0.19 | (Milling) |
| Invention | 14 | TiCNO(0.1) | Granular | Al₂O₃ (0.8) | α:100% | TiCN(0.2) | Granular | 0.20 | (Milling) |

Note: ALT denotes an average layer thickness in μm; κ denotes a κ-type; and α denotes an α-type.

TABLE 6-1

| | | | Hard Coating | | | | | | |
|---|---|---|---|---|---|---|---|---|---|
| | | 1st Layer | | | | 2nd Layer | | | |
| Type | Substrate Symbol | Composition (ALT) | Crystal Structure | W (atomic %) | Co (atomic %) | Composition (ALT) | Crystal Structure | W (atomic %) | Co (atomic %) |
| Coated Cemented Carbide Blade Members of the Invention | 15 | C | TiN(0.7) | Granular | 10.6 | 8.9 | TiCN(3.6) | Elongated Growth | 8.9 | 12.5 |
| | 16 | C | TiN(1.1) | Granular | 5.5 | 5.3 | TiCN(3.7) | Elongated Growth | 2.0 | 3.1 |
| | 17 | C | TiN(2.4) | Granular | 4.2 | 4.3 | TiCN(16.0) | Elongated Growth | 0.7 | 0.9 |
| | 18 | A | TiC(0.2) | Granular | 16.2 | 19.3 | TiCN(3.4) | Elongated Growth | 7.1 | 15.4 |
| | 19 | B | TiCN(0.2) | Granular | 15.3 | 12.2 | TiCN(3.1) | Elongated Growth | 6.1 | 10.5 |
| | 20 | D | TiC(0.2) | Granular | 21.6 | 17.9 | TiCN(3.9) | Elongated Growth | 6.5 | 14.9 |
| | 21 | D | TiC(0.2) | Granular | 21.1 | 17.9 | TiCN(3.8) | Elongated Growth | 6.4 | 14.7 |

Note: ALT denotes an average layer thickness in μm.
W and Co denote the contents at the grain boundaries.

TABLE 6-2

| | | Hard Coating | | | | | |
|---|---|---|---|---|---|---|---|
| | | Intermediate Layer | | | | 3rd Layer | |
| Type | | Composition (ALT) | Crystal Structure | W (atomic %) | Co (atomic %) | Composition (ALT) | Crystal Structure |
| Coated Cemented Carbide Blade Members of the Invention | 15 | TiC(2.9) | Granular | — | — | Al₂O₃ (5.8) | κ:100% |
| | 16 | TiC(3.4) | Granular | — | — | Al₂O₃ (6.0) | α:100% |
| | 17 | TiC(4.1) | Granular | — | — | Al₂O₃ (1.1) | α:100% |
| | 18 | TiC(2.2) | Granular | — | — | Al₂O₃ (10.4) | κ:85% |
| | 19 | TiC(2.1) | Granular | — | — | Al₂O₃ (11.4) | κ55% |
| | 20 | TiC(1.5) | Granular | — | — | Al₂O₃ (0.8) | κ:100% |
| | 21 | TiC(1.3) | Granular | — | — | Al₂O₃ (0.7) | α:100% |

Note: ALT denotes an average layer thickness in μm.
κ denotes a κ-type.
α denotes an α-type.

TABLE 6-3

| | | Hard Coating | | Flank Wear Width (mm) | |
|---|---|---|---|---|---|
| | | 4th Layer | | Continuous Cutting | Interrupted Cutting |
| Type | | Composition (ALT) | Crystal Structure | | |
| Coated Cemented Carbide Blade Members of the Invention | 15 | — | — | 0.17 | 0.23 |
| | 16 | TiN(0.2) | Granular | 0.18 | 0.22 |
| | 17 | TiCN(0.3) | Granular | 0.31 | 0.28 |
| | 18 | — | — | 0.18 | 0.22 |
| | 19 | — | — | 0.19 | 0.23 |
| | 20 | TiN(0.3) | Granular | 0.21 | (Milling) |
| | 21 | TiCN(0.1) | Granular | 0.20 | (Milling) |

Note: ALT denotes an average layer thickness in μm.

TABLE 7-1

| | | Substrate Symbol | Hard Coating | | | | | | | |
|---|---|---|---|---|---|---|---|---|---|---|
| | | | 1st Layer | | | | 2nd Layer | | | |
| Type | | | Composition (ALT) | Crystal Structure | W (atomic %) | Co (atomic %) | Composition (ALT) | Crystal Structure | W (atomic %) | Co (atomic %) |
| Coated Cemented Carbide Blade Members of the Invention | 22 | C | TiN(0.7) | Granular | 10.4 | 9.3 | TiCN(3.5) | Elongated Growth | 8.9 | 12.4 |
| | 23 | C | TiN(1.2) | Granular | 5.4 | 5.2 | TiCN(3.6) | Elongated Growth | 2.1 | 3.0 |
| | 24 | C | TiN(2.2) | Granular | 4.7 | 4.4 | TiCN(15.9) | Elongated Growth | 0.8 | 1.0 |
| | 25 | A | TiC(0.3) | Granular | 22.1 | 19.6 | TiCN(3.3) | Elongated Growth | 13.2 | 25.8 |
| | 26 | B | TiCN(0.3) | Granular | 15.8 | 12.4 | TiCN(3.2) | Elongated Growth | 5.8 | 10.3 |
| | 27 | D | TiC(0.2) | Granular | 21.4 | 18.1 | TiCN(3.8) | Elongated Growth | 6.7 | 14.7 |
| | 28 | D | TiC(0.2) | Granular | 20.9 | 17.9 | TiCN(3.7) | Elongated Growth | 6.5 | 14.9 |

Note: ALT denotes an average layer thickness in μm.
W and Co denote the contents at the grain boundaries.

TABLE 7-2

| | | Hard coating | | | | | |
|---|---|---|---|---|---|---|---|
| | | Intermediate Layer | | | | Intervening Layer | |
| Type | | Composition (ALT) | Crystal Structure | W (atomic %) | Co (atomic %) | Composition (ALT) | Crystal Structure |
| Coated Cemented Carbide Blade Members of the Invention | 22 | TiC(3.0) | Granular | — | — | TiCNO(0.1) | Granular |
| | 23 | TiC(3.2) | Granular | — | — | TiCNO(0.2) | Granular |
| | 24 | TiC(4.4) | Granular | — | — | TiCNO(0.1) | Granular |
| | 25 | TiC(2.0) | Granular | — | — | TiCO(0.2) | Granular |
| | 26 | TiC(1.9) | Granular | — | — | TiCO(0.3) | Granular |
| | 27 | TiC(1.4) | Granular | — | — | TiCNO(0.1) | Granular |
| | 28 | TiC(1.5) | Granular | — | — | TiCNO(0.2) | Granular |

Note: ALT denotes an average layer thickness in μm.

TABLE 7-3

| | | Hard Coating | | | | Flank Wear Width (mm) | |
|---|---|---|---|---|---|---|---|
| | | 3rd Layer | | 4th Layer | | | |
| Type | | Composition (ALT) | Crystal Structure | Composition (ALT) | Crystal Structure | Continuous Cutting | Interrupted Cutting |
| Coated Cemented Carbide Blade Members of the Invention | 22 | $Al_2O_3$ (5.8) | κ:100% | — | — | 0.15 | 0.21 |
| | 23 | $Al_2O_3$ (6.0) | α:100% | TiN(0.4) | Granular | 0.16 | 0.21 |
| | 24 | $Al_2O_3$ (1.0) | α:100% | TiCN(0.3) | Granular | 0.32 | 0.29 |
| | 25 | $Al_2O_3$ (10.8) | κ:85% | — | — | 0.18 | 0.21 |
| | 26 | $Al_2O_3$ (11.2) | κ:55% | — | — | 0.19 | 0.22 |
| | 27 | $Al_2O_3$ (0.6) | κ:100% | TiN(0.2) | Granular | 0.20 | (Milling) |
| | 28 | $Al_2O_3$ (0.7) | α:100% | TiCN(0.2) | Granular | 0.21 | (Milling) |

Note: ALT denotes an average layer thickness in μm.
κ denotes a κ-type.
α denotes an α-type.

TABLE 8-1

| | | | Hard Coating | | | | | | |
|---|---|---|---|---|---|---|---|---|---|
| | | | 1st Layer | | | | 2nd Layer | | |
| Type | | Substrate Symbol | Composition (ALT) | Crystal Structure | W (atomic %) | Co (atomic %) | Composition (ALT) | Crystal Structure | W (atomic %) | Co (atomic %) |
| Coated Cemented Carbide Blade Members of the Invention | 29 | C | TiN(1.1) | Granular | 6.8 | 6.5 | TiCN(7.3) | Elongated Growth | 1.2 | 3.6 |
| | 30 | A | TiC(0.3) | Granular | 11.3 | 10.9 | TiCN(12.1) | Elongated Growth | 3.2 | 8.7 |
| | 31 | B | TiN(0.2) | Granular | 18.5 | 16.4 | TiCN(5.8) | Elongated Growth | 9.5 | 11.2 |
| | 32 | D | TiN(0.3) | Granular | 16.4 | 16.9 | TiCN(9.2) | Elongated Growth | 8.8 | 10.4 |
| | 33 | C | TiN(0.5) | Granular | 12.5 | 10.9 | TiCN(4.5) | Elongated Growth | 7.1 | 8.7 |

Note: ALT denotes an average layer thickness in μm.
W and Co denote the contents at the grain boundaries.

TABLE 8-2

| | | Hard Coating | | | |
|---|---|---|---|---|---|
| | | Intermediate Layer | | Intervening Layer | |
| Type | | Composition (ALT) | Crystal Structure | Composition (ALT) | Crystal Structure |
| Coated Cemented Carbide Blade Members of the Invention | 29 | — | — | — | — |
| | 30 | — | — | — | — |
| | 31 | TiC(1.2) | Granular | — | — |
| | 32 | — | — | TiCO(0.5) | Granular |
| | 33 | TiC(0.8) | Granular | TiCNO(0.2) | Granular |

Note: ALT denotes an average layer thickness in μm.

TABLE 8-4

| | | Hard Coating 4th Layer | | Flank Wear Width (mm) | |
|---|---|---|---|---|---|
| Type | | Composition (ALT) | Crystal Structure | Continuous Cutting | Interrupted Cutting |
| Coated Cemented Carbide Blade Members of the Invention | 29 | — | — | 0.15 | 0.19 |
| | 30 | TiN(0.1) | Granular | 0.14 | 0.18 |
| | 31 | TiCN(0.1) | Granular | 0.11 | 0.13 |
| | 32 | TiN(0.1) | Granular | 0.12 | 0.10 |
| | 33 | TiN(0.1) | Granular | 0.16 | (Milling) |

Note: ALT denotes an average layer thickness in μm.

TABLE 8-3

| | | Hard Coating 3rd Layer | | | | | | | |
|---|---|---|---|---|---|---|---|---|---|
| | | 1st Sublayer | | 1st Dividing Layer | 2nd Sublayer | | 2nd Dividing Layer | 3rd Sublayer | |
| Type | | Composition (ALT) | Crystal Structure | | Composition (ALT) | Crystal Structure | | Composition (ALT) | Crystal Structure |
| Coated Cemented Carbide Blade Members of the Invention | 29 | Al₂O₃(2.1) | κ:100% | TiN(0.2) | Al₂O₃(3.5) | α:100% | — | — | — |
| | 30 | Al₂O₃(3.2) | α:100% | TiC(0.2) | Al₂O₃(4.1) | α:100% | — | — | — |
| | 31 | Al₂O₃(4.0) | κ:85% | TiCNO(0.2) | Al₂O₃(4.0) | κ:85% | — | — | — |
| | 32 | Al₂O₃(1.6) | κ:100% | TiCNO(0.1) | Al₂O₃(1.6) | κ:100% | TiCN(0.1) | Al₂O₃(3.2) | κ:100% |
| | 33 | Al₂O₃(2.5) | κ:100% | TiCO(0.1) | Al₂O₃(2.5) | κ:100% | TiCNO(0.2) | Al₂O₃(2.5) | κ:100% |

Note: ALT denotes an average layer thickness in μm.
κ denotes a κ-type.
α denotes an α-type.

TABLE 9-1

| Type | | Substrate Symbol | Hard Coating | | | | | | | |
|---|---|---|---|---|---|---|---|---|---|---|
| | | | 1st Layer | | | | 2nd Layer | | | |
| | | | Composition (ALT) | Crystal Structure | W (atomic %) | Co (atomic %) | Composition (ALT) | Crystal Structure | W (atomic %) | Co (atomic %) |
| Comparative Coated Cemented Carbide Blade Member | 1 | D | TiN(1.1) | Granular | — | — | TiCN(8.5) | Granular | — | — |
| | 2 | A | TiC(0.9) | Granular | 1.7 | 8.2 | TiCN(5.4) | Granular | 0.2 | 2.5 |
| | 3 | B | TiN(2.0) | Granular | 0.9 | 5.2 | TiCN(7.3) | Granular | — | — |
| | 4 | C | TiC(0.2) | Granular | 1.6 | 7.9 | TiCN(15.8) | Granular | — | 0.5 |
| | 5 | D | TiN(3.0) | Granular | — | — | TiCN(5.9) | Granular | — | — |
| | 6 | A | TiC(0.9) | Granular | 0.7 | 6.4 | TiCN(8.7) | Granular | 0.1 | 1.8 |
| | 7 | D | TiN(4.0) | Granular | — | — | TiCN(12.0) | Granular | — | — |
| | 8 | C | TiC(2.3) | Granular | 0.8 | 6.3 | TiCN(7.2) | Granular | 0.2 | 0.7 |
| | 9 | A | TiC(1.5) | Granular | 1.2 | 8.6 | TiCN(6.8) | Granular | 0.3 | 1.1 |
| | 10 | D | TiN(2.5) | Granular | — | — | TiCN(9.3) | Granular | — | — |
| | 11 | B | TiC(0.5) | Granular | 1.3 | 7.8 | TiCN(7.0) | Granular | 0.2 | 1.4 |

Note: ALT denotes an average layer thickness in μm.
W and Co denote the contents at the grain boundaries.

TABLE 9-2

| Type | | Hard Coating | | | |
|---|---|---|---|---|---|
| | | Intermediate Layer | | Intervening Layer | |
| | | Composition (ALT) | Crystal Structure | Composition (ALT) | Crystal Structure |
| Comparative Coated Cemented Carbide Blade Member | 1 | — | — | — | — |
| | 2 | — | — | — | — |
| | 3 | TiC(0.9) | Granular | — | — |
| | 4 | TiC(1.2) | Granular | — | — |
| | 5 | TiC(2.5) | Granular | — | — |
| | 6 | — | — | TiCO(1.2) | Granular |
| | 7 | — | — | TiCO(0.8) | Granular |
| | 8 | — | — | TiCNO(1.7) | Granular |
| | 9 | TiC(0.7) | Granular | TiCO(0.5) | Granular |
| | 10 | TiC(1.2) | Granular | TiCNO(0.7) | Granular |
| | 11 | TiC(3.2) | Granular | TiCNO(1.1) | Granular |

Note: ALT denotes an average layer thickness in μm.

TABLE 9-3

| Type | | Hard Coating | | | | Flank Wear Width (mm) | |
|---|---|---|---|---|---|---|---|
| | | 3rd Layer | | 4th Layer | | | |
| | | Composition (ALT) | Crystal Structure | Composition (ALT) | Crystal Structure | Continuous Cutting | Interrupted Cutting |
| Comparative Coated Cemented Carbide Blade Member | 1 | Al$_2$O$_3$(2.5) | α:100% | TiN(0.2) | Granular | Failure after 17.9 min. due to Chipping | Failure after 19.2 min. due to Chipping |
| | 2 | Al$_2$O$_3$(5.7) | α:100% | — | — | Failure after 13.5 min. due to Chipping | Failure after 15.6 min. due to Chipping |
| | 3 | Al$_2$O$_3$(4.0) | α:100% | — | — | Failure after 4.4 min. due to Layer Separation | Failure after 3.9 min. due to Layer Separation |
| | 4 | Al$_2$O$_3$(1.6) | α:100% | TiN(0.3) | Granular | Failure after 12.7 min. due to Chipping | Failure after 17.3 min. due to Chipping |
| | 5 | Al$_2$O$_3$(3.7) | α:100% | TiN(0.2) | Granular | Failure after 9.8 min. due to Layer Separation (Milling) | |
| | 6 | Al$_2$O$_3$(5.3) | α:100% | — | — | Failure after 16.3 min. due to Chipping | Failure after 15.6 min. due to Chipping |
| | 7 | Al$_2$O$_3$(7.3) | α:100% | — | — | Failure after 7.3 min. due to Layer Separation | Failure after 4.2 min. due to Layer Separation |
| | 8 | Al$_2$O$_3$(4.0) | α:100% | TiN(0.3) | Granular | Failure after 15.3 min. due to Chipping (Milling) | |
| | 9 | Al$_2$O$_3$(8.7) | α:100% | — | — | Failure after 9.2 min. due to Chipping | Failure after 7.5 min. due to Chipping |
| | 10 | Al$_2$O$_3$(5.9) | α:100% | TiN(0.2) | Granular | Failure after 2.3 min. due to Layer Separation | Failure after 3.7 min. due to Layer Separation |

TABLE 9-3-continued

| | Hard Coating | | | | Flank Wear Width (mm) | |
|---|---|---|---|---|---|---|
| | 3rd Layer | | 4th Layer | | | |
| Type | Composition (ALT) | Crystal Structure | Composition (ALT) | Crystal Structure | Continuous Cutting | Interrupted Cutting |
| 11 | Al$_2$O$_3$(7.1) | α:100% | — | — | Failure after 12.7 min. due to Chipping (Milling) | |

Note: ALT denotes an average layer thickness in μm.
α denotes an α-type.

What is claimed is:

1. A surface-coated tungsten carbide-based cemented carbide blade member comprising:

a substrate of a tungsten carbide-based cemented carbide containing at least tungsten and cobalt; and a hard coating of an average layer thickness of 3 to 30 μm formed on said substrate and including a first layer deposited on said substrate, a second layer deposited on said first layer and a third layer deposited on said second layer, wherein said first layer has a granular crystal structure, and said second layer has a crystal structure of unilaterally grown elongated crystals; and wherein among constituents forming said substrate, at least tungsten and cobalt are diffused into grain boundaries of said first and second layers, wherein the diffused amounts by atomic % of the tungsten (W) and cobalt (Co) are greater at a portion adjacent to the substrate and decrease towards a top surface of the hard coating, and wherein the atomic ratio of tungsten to cobalt at the portion adjacent to the substrate satisfies the following relationship:

$$3/5 < W/Co.$$

2. A surface-coated cemented carbide blade member as defined in claim 1, wherein said tungsten carbide-based cemented carbide substrate is entirely homogeneous in structure, or has a surface zone rich in binder constituents, and wherein said first layer is formed of at least one of the group consisting of titanium nitride, titanium carbide and titanium carbonitride, said second layer being formed of titanium carbonitride, said third layer being formed of aluminum oxide based on κ-type and/or α-type crystals.

3. A surface-coated cemented carbide blade member as defined in claim 2, wherein said hard coating further has an intermediate layer of titanium carbide formed between said second layer and said third layer so as to have a granular crystal structure and a layer thickness of 0.1 to 5 μm.

4. A surface-coated cemented carbide blade member as defined in claim 2, wherein said hard coating layer further includes an intervening layer of one compound selected from the group consisting of titanium oxycarbide and titanium oxycarbonitride, said intervening layer being formed between said second layer and said third layer so as to have a granular crystal structure and a layer thickness of 0.1 to 5 μm.

5. A surface-coated cemented carbide blade member as defined in claim 3, wherein said hard coating further includes an intervening layer of one compound selected from the group consisting of titanium oxycarbide and titanium oxycarbonitride, said intervening layer being formed between said intermediate layer and said third layer so as to have a granular structure and having a layer thickness such that the total thickness of said intervening layer and said intermediate layer ranges from 0.1 to 5 μm.

6. A surface-coated cemented carbide blade member as defined in any one of claims 2 to 5, wherein said hard coating further comprises a fourth layer of granular structure deposited on said third layer, said fourth layer being formed of a compound selected from the group consisting of titanium nitride and titanium carbonitride.

7. A surface-coated cemented carbide blade member as defined in any one of claims 2 to 5, wherein said third layer has a composite layer structure of at least three sublayers formed of at least one compound selected from the group consisting of titanium carbide, titanium nitride, titanium carbonitride, titanium oxycarbide and titanium oxycarbonitride, and wherein the thickness of each sublayer is from 0.01 to 1 μm, whereas the thickness of the composite layer structure is from 1 to 10 μm.

8. A surface-coated cemented carbide blade member as defined in claim 6, wherein said third layer has a composite layer structure of at least three sublayers formed of at least one compound selected from the group consisting of titanium carbide, titanium nitride, titanium carbonitride, titanium oxycarbide and titanium oxycarbonitride, and wherein the thickness of each sublayer is from 0.01 to 1 μm, whereas the thickness of the composite layer structure is from 1 to 10 μm.

9. A surface-coated tungsten carbide-based cemented carbide blade member comprising:

a substrate of a tungsten carbide-based cemented carbide containing at least tungsten and cobalt; and a hard coating of an average layer thickness of 3 to 30 μm formed on said substrate and including a first layer deposited on said substrate, a second layer deposited on said first layer and a third layer deposited on said second layer, wherein said first layer has a granular crystal structure, and said second layer has a crystal structure of unilaterally grown elongated crystals; and wherein among constituents forming said substrate, at least tungsten and cobalt are diffused into grain boundaries of said first and second layers, wherein the diffused amounts by atomic % of the tungsten (W) and cobalt (Co) are greater at a portion adjacent to the substrate and decrease towards a top surface of the hard coating, and wherein the atomic ratio of tungsten to cobalt at a zone 0.1 to 0.3 μm away from the substrate satisfies the following relationship:

$$3/5 < W/Co.$$

* * * * *